US009087890B2

(12) United States Patent
Sato

(10) Patent No.: US 9,087,890 B2
(45) Date of Patent: Jul. 21, 2015

(54) SEMICONDUCTOR DEVICE

(75) Inventor: Ken Sato, Saitama (JP)

(73) Assignee: Sanken Electric Co., LTD., Niiza-shi, Saitama (JP)

( * ) Notice: Subject to any disclaimer, the term of this patent is extended or adjusted under 35 U.S.C. 154(b) by 241 days.

(21) Appl. No.: 12/859,856

(22) Filed: Aug. 20, 2010

(65) Prior Publication Data

US 2011/0049527 A1    Mar. 3, 2011

(30) Foreign Application Priority Data

Aug. 26, 2009 (JP) .................. 2009-195136

(51) Int. Cl.
*H01L 29/15* (2006.01)
*H01L 29/778* (2006.01)
*H01L 29/66* (2006.01)
H01L 29/47 (2006.01)

(52) U.S. Cl.
CPC ...... *H01L 29/7786* (2013.01); *H01L 29/66462* (2013.01); *H01L 29/475* (2013.01)

(58) Field of Classification Search
CPC .............. H01L 29/7783; H01L 29/207; H01L 21/0251; H01L 29/432; H01L 33/007
USPC .............. 257/76, 194, 190, E29.089
See application file for complete search history.

(56) References Cited

U.S. PATENT DOCUMENTS

| | | | |
|---|---|---|---|
| 6,921,923 B1 * | 7/2005 | Shibata ........................ | 257/94 |
| 7,329,909 B2 | 2/2008 | Saito et al. | |
| 7,569,870 B2 | 8/2009 | Yanagihara et al. | |
| 2002/0028343 A1 * | 3/2002 | Shibata et al. ............... | 428/602 |
| 2002/0117961 A1 * | 8/2002 | Hori et al. ..................... | 313/498 |
| 2004/0261693 A1 * | 12/2004 | Lai et al. ....................... | 117/86 |
| 2005/0110043 A1 * | 5/2005 | Otsuka et al. ................ | 257/194 |
| 2005/0263791 A1 | 12/2005 | Yanagihara et al. | |
| 2006/0170003 A1 | 8/2006 | Saito et al. | |
| 2006/0175633 A1 * | 8/2006 | Kinzer .......................... | 257/192 |
| 2008/0179694 A1 | 7/2008 | Nakazawa et al. | |
| 2008/0237639 A1 | 10/2008 | Nanjo et al. | |
| 2009/0127564 A1 | 5/2009 | Irikura et al. | |

FOREIGN PATENT DOCUMENTS

JP   2003-243424 A   8/2003
JP   2004-235473 A   8/2004

(Continued)

OTHER PUBLICATIONS

Notification of Reasons for Refusal issued in corresponding Japanese Patent Application No. 2009-195136 mailed Jan. 29, 2014.

*Primary Examiner* — Wael Fahmy
*Assistant Examiner* — Sarah Salerno
(74) *Attorney, Agent, or Firm* — Banner & Witcoff, Ltd.

(57) ABSTRACT

A semiconductor device comprising: an active layer, which has a composition represented by the formula: $Al_xM_yGa_{1-x-y}N$, wherein x satisfies $0 \le x \le 1$, wherein y satisfies $0 \le y \le 1$, wherein x+y satisfies $0 \le x+y \le 1$, and wherein M contains at least one of In and B; a substrate containing GaN; and a buffer layer provided between the active layer and the substrate, wherein the semiconductor device is operated by electrical current flowing through the active layer in a direction parallel to a face of the substrate, wherein the buffer layer has a composition represented by the formula: $Al_pIn_{1-p}N$, wherein p satisfies $0 \le p < 1$, and wherein the buffer layer, which has a band gap energy wider than that of the substrate, and which is lattice-matched to the substrate.

13 Claims, 4 Drawing Sheets

(56) References Cited

FOREIGN PATENT DOCUMENTS

| | | |
|---|---|---|
| JP | 2006-216671 A | 8/2006 |
| JP | 2008-072029 A | 3/2008 |
| JP | 2008-211172 A | 9/2008 |
| JP | 2008-243881 A | 10/2008 |
| JP | 2009-021362 A | 1/2009 |
| JP | 2009-126727 A | 6/2009 |
| WO | 2004/066393 A1 | 8/2004 |

* cited by examiner

SEMICONDUCTOR DEVICE

CROSS-REFERENCE TO RELATED APPLICATION

This application claims priority from Japanese Patent Application No. 2009-195136 filed on Aug. 26, 2009, the entire subject matter of which is incorporated herein by reference.

BACKGROUND

1. Technical Field

The present invention relates to a structure of a semiconductor device including an active region on a hetero junction of a nitride semiconductor.

2. Description of the Related Art

As a semiconductor device using a compound semiconductor, specifically, as a device for high power and high frequency, an High Electron Mobility Transistor (HEMT) device using such as GaN has been used. A schematic structure of a cross-section of an HEMT device 90 is shown in FIG. 4. In this figure, an electron transit layer 93 and an electron supply layer 94 are formed by an epitaxial growth method over a buffer layer 92 on a substrate 91. Here, the electron transit layer 93 is made of non-doped GaN, and the electron supply layer 94 is made of non-doped AlGaN (strictly, $Al_xGa_{1-x}N$, x=about 0.20). Here, a two-dimensional electron gas layer is formed on a portion of the electron transit layer in an interface between the electron transit layer 93 and the electron supply layer 94. The two-dimensional electron gas layer is formed between a source electrode 95 and a drain electrode 96, and electrical current flows through the two-dimensional electron gas layer. Here, a channel of the two-dimensional electron gas layer is controlled on-off by voltage applied to a gate electrode 97, and a switching operation of the transistor is performed. At this time, because a speed (mobility) of the electrons within the two-dimensional electron gas layer is extremely high, high speed operation is possible. Moreover, GaN has larger band gap energy than GaAs, etc., the HEMT device 90 has high insulation withstand voltage and can be perform high power operation. In this case, in order to obtain better amplification or switching characteristics, it is necessary to enhance an on-off ratio of the current flowing between the source electrode 95 and drain electrode 96, or a ratio of electrical resistance between the source electrode 95 and the drain electrodes 96 in the turning-off time to electrical resistance therebetween in the turning-on time. Incidentally, FIG. 4 merely shows the simplest structure of the HEMT device is shown FIG. 4. However, in practice, a contacting shape between the source or drain electrodes 95, 96 and the electron supply layer 94 or a shape around the gate electrode 97, etc., may be more optimized. Thus, a practical structure of the HEMT device may be different from the structure of the HEMT device in FIG. 4.

The electron transit layer 93 or the electron supply layer 94 is formed by the epitaxial growth over the substrate 91, and properties of the HEMT device 90 are considerably affected by a crystalline state of the electron transit layer 93 and the electron supply layer 94. Since the crystalline state and the manufacturing cost is considerably affected by the substrate 91, choosing what kind of the substrate 91 is important. For example, sapphire or semi-insulating SiC, etc., may be used as the substrate 91. However, because it is difficult to form the electron transit layer 93 (non-doped GaN) with better crystalline state directly on the material (wafer) such as sapphire or semi-insulating SiC, it is necessary that forming a buffer layer 92 made of other material between the substrate 91 and the electron transit layer 93.

Recently, as GaN wafer, n-GaN (n type GaN) wafer, which has a size easy to operate, can be obtain at a low cost and can be used as the substrate 91. For example, a fourth embodiment of JP-A-2009-12727 discloses a structure of the HEMT device in which wafer is used as a substrate 91. In this case, since the material of the substrate 91 is identical with that of the layer 93, it is comparatively easy to form non-doped GaN with the better crystalline state as the electron transit layer 93 on such the GaN substrate 91.

Further, in view of reducing on-resistance of the HEMT device 90, for example, FIG. 13 and FIG. 14 in JP-A-2006-216671 discloses that the through-hole electrode penetrating from the source electrode 95 to the substrate 91 is formed. Thus, a potential of the source electrode 95 intentionally comes to equal to the potential of the substrate 91 by the through-hole electrode. Accordingly, a reverse face electrode formed with a large size on the reverse face of the substrate 91 can be used as the source electrode. Therefore, as described in the paragraph [0046] of JP-A-2006-216671, it is not necessary to form a source electrode pad on the front surface (upper face) of the HEMT device 90, the entire area of the chip can be use effectively.

However, in the above-described arts, there is a problem with respect to the insulation withstand voltage or a leak current between the source electrode 95 and drain electrode 96, when high voltage is applied therebetween. That is, an insulation resistance between the source electrode 95 and drain electrode 96 becomes lower, or the leak current also flow even at pinch-off operation in the turning-on time, and then it may trouble in operation of the device.

As described above, the two-dimensional electron gas (channel), which is a main body of the current flowing in the turning-on time, pass through beneath the gate electrode 97 and is on-off controlled by the voltage applied to the gate electrode 97. However, electrical currents flow between the source electrode 95 and drain electrode 96 through paths other than the channel controlled by the gate voltage. The currents flowing through the other paths may become a main body of the leak current. As examples of the other paths, as indicated in FIG. 4 by arrows, there are paths passing through the buffer layer 92 and the substrate 91. If above described n-GaN wafer is used as the substrate 91, the n-GaN substrate 91 in itself is conductive, so that the leak current flows in the substrate 91.

In order to improve such a problem, it may be considered that MN layer, which is known to have larger band gap energy than that of GaN and has better insulation property, or non-doped AlGaN, which is mixed crystal of MN and GaN, is formed as the buffer layer 92 on n-GaN wafer (the substrate 91) and the electron transit layer 93 is formed on the buffer layer 92. However, in this case, it occurs great lattice mismatch (difference between lattice constants) between the buffer layer 92 made of AlN or AlGaN and the electron transit layer 93 made of GaN. Therefore, many crystal defects such as dislocations, etc., are generated in the interface between the buffer layer 92 and the electron transit layer 93, so that those crystal defects cause the electric conduction through thereof. Accordingly, the leak current (buffer leak) flow between the source electrode 95 and drain electrodes 96. This phenomenon also occurs when the sapphire or SiC, etc., is used as the substrate.

This problem is not limited to only the HEMT device also other devices, which include an substrate including GaN and an active layer having a hetero structure on the substrate, and in which electric current flows in a lateral direction (i.e. a direction parallel to the surface of the substrate) for operating the device. Examples of such devices may be Metal Oxide Semiconductor Field Effect Transistor (MOSFET) or Schottky Barrier Diode (SBD), etc.

Accordingly, in a prior art, it is difficult to manufacture the device in which the buffer leak is reduced on the substrate containing GaN.

The present invention is made with considering the above problem, and provides the device solved the problem.

SUMMARY

Accordingly, a purpose of the present invention is to provide a device in which the leak current (buffer leak) reduces on the GaN substrate. The present invention includes following configuration. A semiconductor device comprising: an active layer, which has a composition represented by the formula: $Al_xM_yGa_{1-x-y}N$, wherein x satisfies $0 \le x \le 1$, wherein y satisfies $0 \le y \le 1$, wherein x+y satisfies $0 \le x+y \le 1$, and wherein M contains at least one of In and B; a substrate containing GaN; and a buffer layer provided between the active layer and the substrate, wherein the semiconductor device is operated by electrical current flowing through the active layer in a direction parallel to a face of the substrate, wherein the buffer layer has a composition represented by the formula: $Al_pIn_{1-p}N$, wherein p satisfies $0 \le p \le 1$, and wherein the buffer layer, which has a band gap energy wider than that of the substrate, and which is lattice-matched to the substrate.

According to the present invention, it is possible to manufacture the device in which the buffer leak is reduced on the substrate including GaN.

DETAILED DESCRIPTION OF THE EMBODIMENTS

A semiconductor device according to an embodiment of the present invention, specifically, a High Electron Mobility Transistor (HEMT) device will be described in detail. In the HMET device, a hetero structure is formed on a GaN substrate, and the HEMT device is operated by the electric current flowing in a lateral direction (in a direction parallel to the surface of the substrate). At this time, the present device includes a configuration by which the buffer leak or leak current flowing in a vertical direction is suppressed.

First Embodiment

Figure 1:
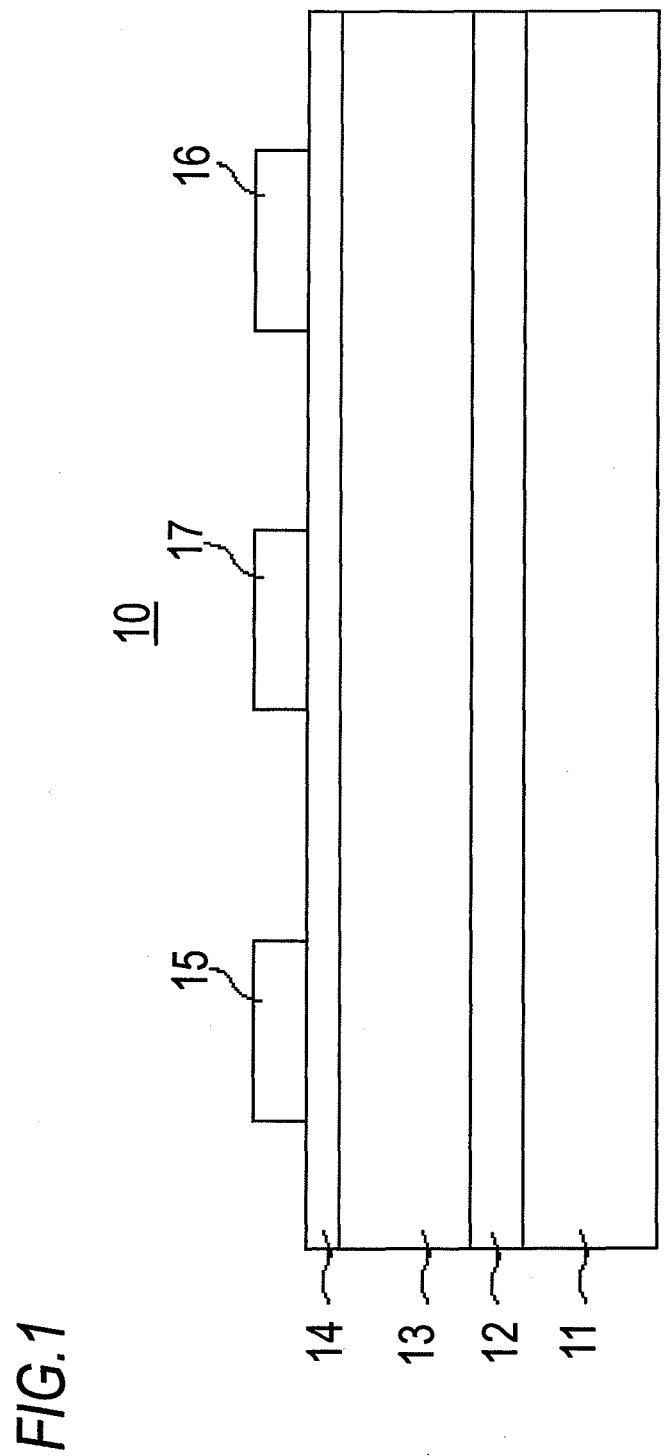
FIG. 1 is a view showing a structure of a cross-section of an HEMT device according to a first exemplary embodiment of the present invention.

FIG. 1 is a view showing a structure of a cross-section of the HEMT device 10 according to a first exemplary embodiment of the present invention. The HEMT device 10 uses n-GaN (n type GaN wafer) as a substrate 11. Non-doped (semi-insulating) $Al_pIn_{1-p}N$ ($0<p<1$) is used as a buffer layer 12 on the substrate 11. Here, the term "non-doped" means that an impurity is not intentionally introduced in order to control conductance level. On the buffer layer 12, both an electron transit layer 13 made of non-doped GaN and an electron supply layer 14 made of non-doped AlGaN on the layer 13 are formed by a Molecular Beam Epitaxy (MBE) method or a Metal Organic Vapor Phase Epitaxy method (MOVPE) in order. Both the electron transit layer 13 and the electron supply layer 14 function as an active layer in the HEMT device 10. Precisely, the non-doped AlGaN forming the electron supply layer 14 is $Al_xGa_{1-x}N$ (preferably $0.1<x<0.3$, specifically x=about 0.20). A source electrode 15 and a drain electrode 16 are formed on the electron supply layer 14, two-dimensional electron gas layer is formed at a portion of the electron transit layer 13 in an interface between the electron transit layer 13 and the electron supply layer 14. Turning on/off operation of a channel made of the two-dimensional electron gas layer is controlled by voltage applied through a depletion layer to a gate electrode 17. Both the source electrode 15 and drain electrodes 16 are made of a material, such as Ti/Au, contacting with the two-dimensional electron gas layer in an ohmic manner. The gate electrode 17 is made of a material, such as Ni/Au, contacting with the non-doped AlGaN layer in a schottky manner and form a depletion layer in the non-doped AlGaN layer. Meanwhile, the electron supply layer 14 may be made of AlGaN layer having n type conductance.

The HEMT device 10 is characterized in that the buffer layer 12 is made of non-doped $Al_pIn_{1-p}N$. AlInN may be mixed crystal of aluminum nitride (AlN) and indium nitride (InN), and physical properties of AlInN may be controlled by molar fraction between AlN and InN. On the other hand, hereinafter, the molar fraction between AlN and InN is represented by composition ratio (namely, p) of Al in $Al_pIn_{1-p}N$. For example, band gap energy of AlInN may take a value in a range of 0.7 eV to 6.2 eV by gradually increasing the composition ration p of Al. Moreover, a lattice constant of AlInN can be controlled in the same way, thus, the composition ration p of Al can be adjusted in order to acquire a desired lattice constant of AlInN. Further, it is well known that a lattice constant of GaN (at an "a" axis) is approximately 3.18 and a lattice constant of AlInN (at an "a" axis) may take a value in a range of 3.11 to 3.54. In the present example, it is preferable that the composition ration p of Al is as follows: $0.6 \le p \le 0.9$ so that a lattice of $Al_pIn_{1-p}N$ layer (the buffer layer 12) matches with a lattice of GaN layer (so that the lattice constants of the two layers are the same). It is more preferable that the composition ration p of Al is as follows: $0.7 \le p \le 0.85$.

The buffer layer 12 made of the above-described $Al_pIn_{1-p}N$ is formed on the substrate 11 made of GaN, and the electron transit layer 13 made of GaN is formed on the buffer layer 12. Further, the composition ratio of Al in the buffer layer 12 is selected so that the buffer layer 12 lattice-matched with GaN layer as described above. Accordingly, in the semiconductor device according to the first embodiment of the present invention, it can be suppressed the lattice mismatches at the interface between the buffer layer 12 and the electron transit layer 13 and at the interface between the electron transit layer 13 and the electron supply layer 14. As a result, the crystal defects including the dislocations caused by the lattice mismatches can be suppressed, so that the crystal quality is improved.

Further, it is possible that the band gap energy of the buffer layer 12 made of the above $Al_pIn_{1-p}N$ is equal to band gap energy of AlN layer by increasing the composition ratio p of Al. Therefore, the semiconductor device according to the first embodiment of the present invention can be configured so that the semi-insulating buffer layer 12 is interposed between the conductive substrate 11 and the semi-insulating electron transit layer 13.

Accordingly, the buffer leak through the buffer layer 12 is to be reduced, so that the HEMT device 10 with better characteristics can be acquired.

When the buffer layer 12 is formed on the substrate (n type GaN) 11 by the MOVPE method, both a flow rate of source gas (for example, trimethylaluminum: TMA) of Al and a flow rate of source gas (for example, trimethylindium: TMI) may be adjusted to control the composition ratio p. When the buffer layer 12 is formed on the substrate (n type GaN) 11 by the MBE method, Al molecular beam intensity and In molecular beam intensity may be adjusted to control the composition ratio p.

Figure 2:
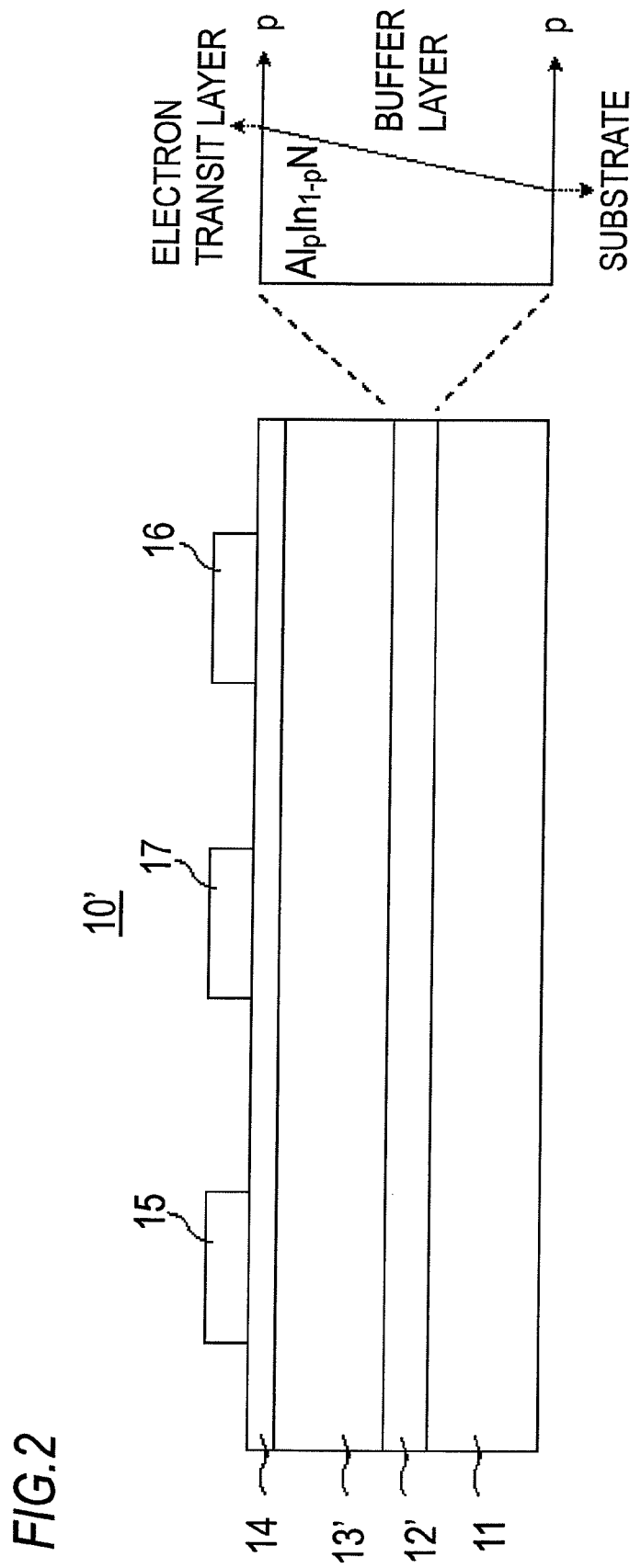
FIG. 2 is a view showing a structure of a cross-section of the HEMT device according to a modification of the first exemplary embodiment of the present invention and a composition distribution of a buffer layer thereof.

FIG. 2 is a view showing a structure of a cross-section (left side) of an HEMT device 10' according to a modification of the first embodiment and composition distribution (right side) in a buffer layer 12' of the HEMT device 10'. Although the electron transit layer 13 is made of the non-doped GaN layer in the first embodiment, an electron transit layer 13' in the modification may be made of a non-doped (semi-insulating) $Al_xGa_{1-x}N$ (0<x<1, preferably 0<x<0.2) layer, for example. In this case, a lattice constant of the substrate 11 is different from a lattice constant of the electron transit layer 13'. Therefore, as shown in FIG. 2, the composition ratio p of Al in the buffer layer 12' changes in a thickness direction. In the modification, when the electron transit layer 13' is made of the non-doped $Al_xGa_{1-x}N$ layer, it is preferable that the composition ratio p of Al in the buffer layer 12' made of $Al_pIn_{1-p}N$ is set so that the composition ratio p at the region adjacent to the electron transit layer 13' is larger than that at the region adjacent to the substrate 11. On the other hand, a changing pattern of the composition ratio p of Al is not limited to a linear changing pattern as shown in FIG. 2, and a step-like changing pattern may be used. Incidentally, the composition ratio p of Al may be appropriately changed by ratio between the lattice constant of the substrate and the lattice constant of the electron transit layer.

Although the buffer layer 12 is made of the non-doped $Al_pIn_{1-p}N$ layer in the first embodiment, any material of the buffer layer 12 may be used which makes average resistivity of the buffer layer 12 larger than the substrate 11 and the electron transit layer 13. Further, impurities such as C, Mg, Fe, etc can be appropriately doped thereto in order to control a resistivity, a stress or a lattice constant of the buffer layer 12.

Meanwhile, although the present invention is applied to the HEMT device in the first embodiment, it is obvious that the present invention is applied to electronic devices other than the HEMT device. According to the present invention, the leak current (buffer leak) through the buffer layer may reduce, so that the insulation withstand voltage may enhance in the electronic devices, in which the buffer layer is disposed between GaN substrate and the active layer, and in which the current flows in the lateral direction (in the direction parallel to the face of GaN substrate).

Second Embodiment

Figure 3:
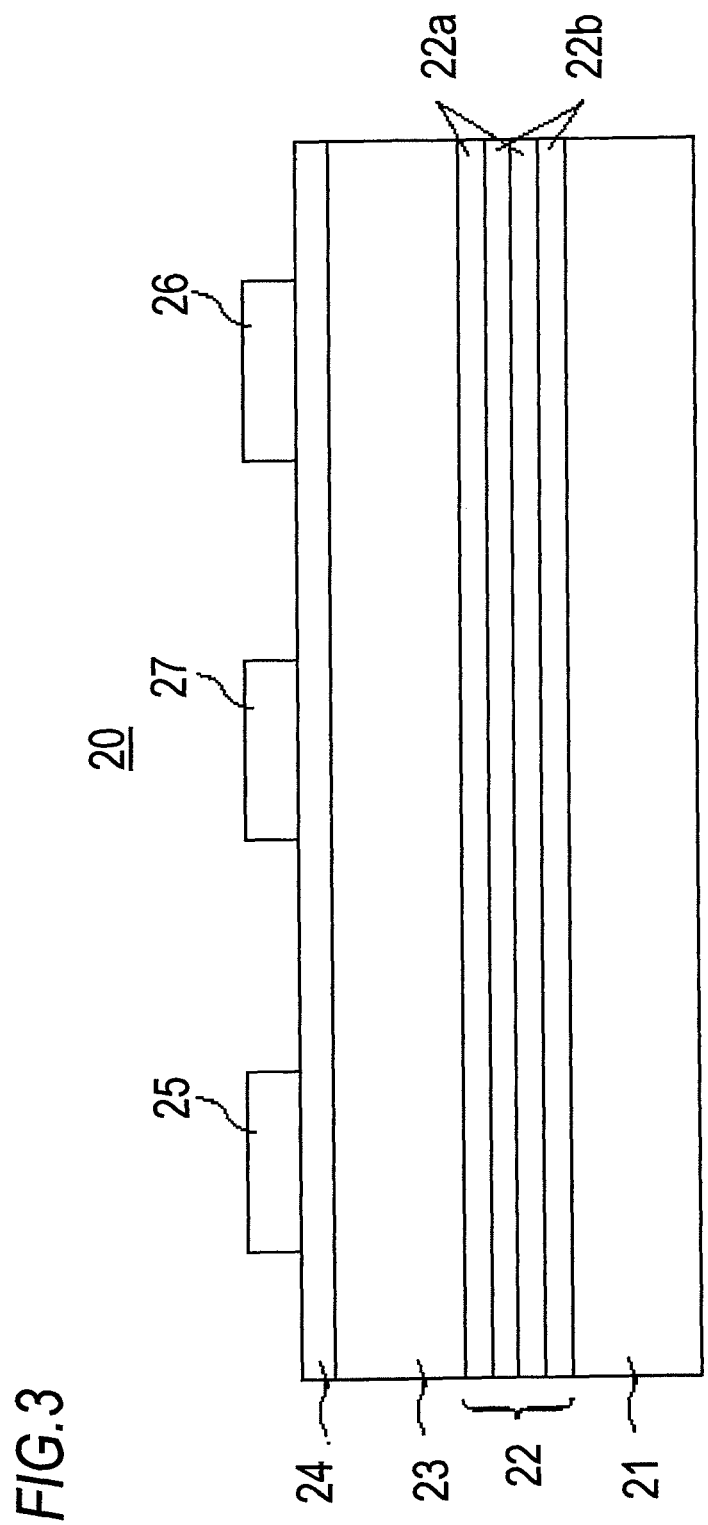
FIG. 3 is a view showing a structure of a cross-section of the HEMT device according to a second exemplary embodiment of the present invention.
Figure 4:
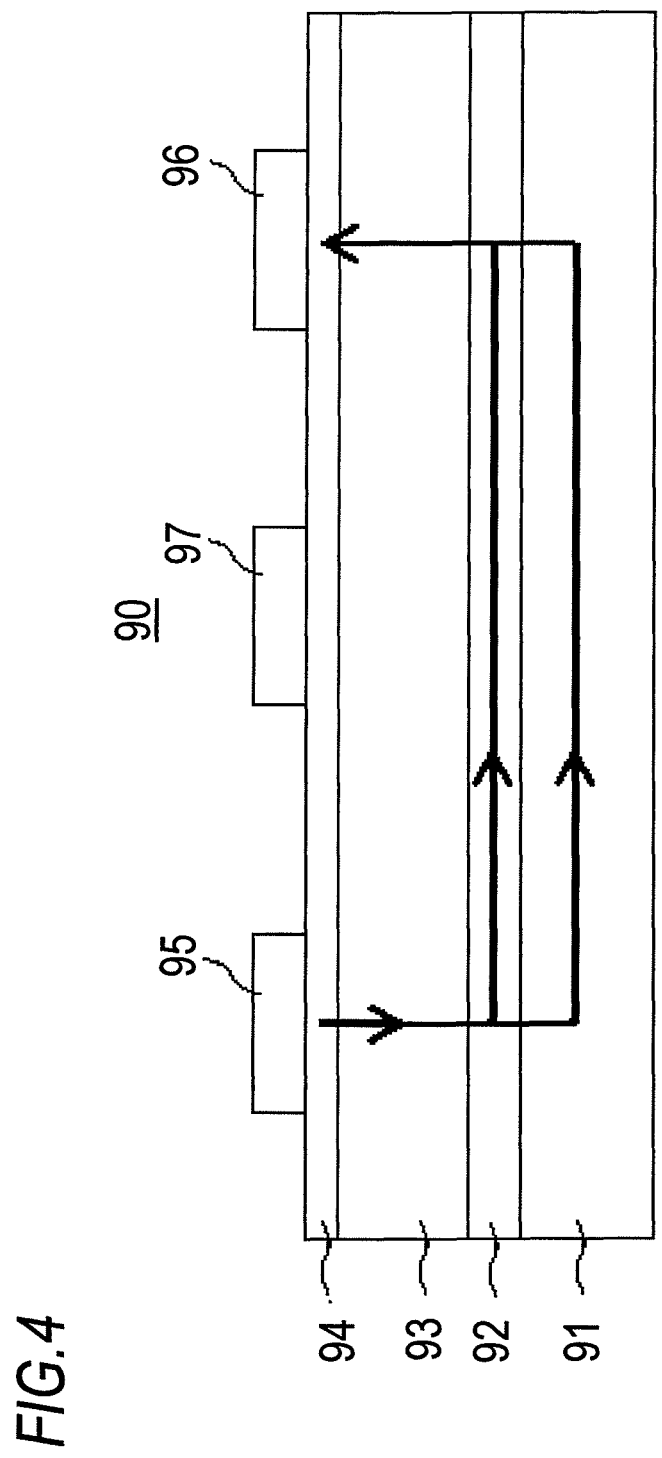
FIG. 4 is a view showing a cross-section of the HEMT device using a nitride semiconductor in a prior-art.

FIG. 3 is a view showing a structure of a cross-section of an HEMT device 20 according to a second embodiment of the present invention. The HEMT device 20 includes a substrate 21 made of n-GaN and a buffer layer 22 formed on the substrate 21. The buffer layer 22 according to this embodiment is formed as a laminated structure in which AlqIn1-qN (0<q<1) layers 22a and p-GaN (p type GaN) layers 22b are alternately laminated. An electron transit layer 23 made of non-doped GaN is formed on the buffer layer 22, and an electron supply layer 24 made of non-doped GaN is formed on the layer electron transit 23. Accordingly, the laminated structure of HEMT device 20 is different in the laminated structure of the buffer layer 22 from the HEMT device 10 in the first embodiment. In addition, configurations of a source electrode 25, a drain electrode 26, and a gate electrode 27 in the second embodiment are similarly to the configurations in the first embodiment.

Although it is possible to lattice-match between $Al_qIn_{1-q}N$ layer 22a and p-GaN layer 22b as the first embodiment, a composition ratio q of Al usually is restricted. However, in the structure according to the second embodiment, because each thin $Al_qIn_{1-q}N$ layers 22a and thin p-GaN layers 22b (p-type GaN) are alternately laminated, it is possible to reduce the lattice-mismatch generated between $Al_qIn_{1-q}N$ layer 22a and GaN layer. The range of options in the composition ratio q of Al, which is considered both the crystal quality and the buffer leak, may increase.

A bottom end of the buffer layer 22 is adjacent to the substrate 21 and is called as a substrate connection region. The p-GaN layer 22b is formed at the bottom end of the buffer layer. According this structure, a p-n junction is formed between the substrate 21 made of n-GaN and the buffer layer 22. Therefore, the buffer leak may reduce, and the HEMT device 20 has better characteristics. Moreover, the top end of the buffer layer 22 is adjacent to the active layer (the electron transit layer 23 and the electron supply layer 24) and is called as an active layer connection region. $Al_qIn_{1-q}N$ layer 22a is formed at the bottom end of the buffer layer. According to this structure, in forming process of an HEMT device 20, Mg or Zn that is impurities within the p-type GaN layer 22b is prevented from diffusing into the electron transit layer 23 of the active layer.

Although the buffer layer 22 shown in FIG. 3 is formed as the laminated structure in which two of $Al_qIn_{1-q}N$ layers 22a and two of p-GaN (p type GaN) layers 22b are alternately laminated with uniform thicknesses, the number and thickness of the laminated layers are not limited as long as the effect of the present invention is accomplished. Further, it may be contemplated that composition ratio of Al in the buffer layer 22 changes in the thickness direction in the same way as in the buffer layer 12' of the modification of the first embodiment.

In the HEMT device 20 according to the second embodiment of the present invention, the material of the substrate 21 is not limited to the substrate made of n-GaN. For example, the substrate 21 may be made of SI-GaN (Semi Insulated-GaN). In the latter case, p-GaN layer 22b functions as an electric-field relaxation layer, which advance the insulation withstand voltage of the HEMT device 20.

As described above, although certain exemplary embodiments of the present invention have been described in detail, the present invention is not limited to the certain exemplary embodiments, and it will be apparent for those skilled in the art. Certain changes, combinations and modifications within a scope of the claimed invention may be possible. For example, it is possible that AlGaN is used as a material of the substrate, or a semiconductor layer forming the electron supply layer is made of InGaN or AlInGaN, or boron (B) is used instead of indium (In).

What is claimed is:

1. A semiconductor device comprising:
an active layer, which has a composition represented by the formula:

$Al_xM_yGa_{1-x-y}N$, wherein x satisfies $0 \leq x \leq 1$,
wherein y satisfies $0 \leq y \leq 1$,
wherein x+y satisfies $0 \leq x+y \leq 1$, and
wherein M contains at least one of In and B;
a substrate containing GaN; and
a buffer layer provided between the active layer and a face of the substrate,
wherein the semiconductor device is operated by electrical current flowing through the active layer in a direction parallel to the face of the substrate,
wherein the buffer layer has a composition represented by the formula:

$Al_p In_{1-p} N$, wherein p satisfies $0 \leq p < 1$, and wherein the buffer layer has a band gap energy wider than that of the substrate and is lattice-matched to the substrate,
wherein a composition ratio of Al and a composition ratio of In in the buffer layer change in a thickness direction such that the buffer layer is lattice-matched to the substrate, and
wherein the composition ratio of Al changes due to a change in the composition ratio of In and the composition ratio of In changes due to a change in the composition ratio of Al.

2. The semiconductor device according to claim 1, wherein a lattice constant of the active layer is equal to or smaller than a lattice constant of the substrate.

3. The semiconductor device according to claim 1, wherein the composition ratio of Al in the buffer layer increases approaching the active layer.

4. The semiconductor device according to claim 1, wherein the buffer layer has the composition represented by the formula: $Al_p In_{1-p} N$, wherein p satisfies $0.6 \leq y \leq 0.9$.

5. The semiconductor device according to claim 1, wherein the active layer has a composition represented by the formula:

$Al_x M_y Ga_{1-x-y} N$, wherein x satisfies $0 \leq x \leq 1$,
wherein y satisfies $0 \leq y \leq 1$,
wherein x+y satisfies $0 \leq x+y \leq 1$, and
wherein M contains at least one of In and B.

6. The semiconductor device according to claim 1, further comprising:
a gate electrode; a source electrode; and a drain electrode,
wherein the gate electrode, the source electrode and the drain electrode are provided on the active layer.

7. The semiconductor device according to claim 1, wherein the active layer comprises:
an electron transit layer; and
an electron supply layer,
wherein the electron supply layer is provided on the electron transit layer.

8. The semiconductor device according to claim 1, wherein the buffer layer comprises:
a first layer, which has the composition represented by the formula:

$Al_p In_{1-p} N$, wherein p satisfies $0 \leq p < 1$; and a second layer, which is made of GaN, and
wherein the buffer layer has a laminated structure of the first layer and the second layer.

9. The semiconductor device according to claim 1, wherein the substrate is a conductive GaN substrate.

10. The semiconductor device according to claim 1, wherein the substrate is a semi-insulating GaN substrate.

11. A semiconductor device comprising:
an active layer including an electron supply layer and an electron transit layer;
a substrate containing GaN; and
a buffer layer provided between the active layer and a face of the substrate,
wherein the semiconductor device is operated by electrical current flowing through the active layer in a direction parallel to the face of the substrate,
wherein the electron supply layer has a composition represented by the formula:

$Al_x Ga_{1-x} N$, wherein x satisfies $0.1 < x < 0.3$, and wherein the electron transit layer has a composition represented by the formula:

$Al_y Ga_{1-y} N$, wherein x satisfies $0 \leq y \leq 0.2$, and wherein x is larger than y,
wherein the buffer layer has a composition represented by the formula:

$Al_p In_{1-p} N$, wherein p satisfies $0.7 \leq p \leq 0.85$, and wherein the buffer layer has a band gap energy wider than that of the substrate and is lattice-matched to the substrate,
wherein a composition ratio of Al and a composition ratio of In in the buffer layer change in a thickness direction such that the buffer layer is lattice-matched to the substrate, and
wherein the composition ratio of Al changes due to a change in the composition ratio of In and the composition ratio of In changes due to a change in the composition ratio of Al.

12. The semiconductor device according to claim 1, wherein the buffer layer comprises:
a first layer, which has the composition represented by the formula:

$Al_p In_{1-p} N$, wherein p satisfies $0 \leq p < 1$; and a second layer, which is made of GaN, and
wherein the buffer layer comprises at least two of the first layer and at least two of the second layer, and
wherein the first layer and the second layer are alternately laminated.

13. A semiconductor device comprising:
an active layer, which has a composition represented by the formula:

$Al_x M_y Ga_{1-x-y} N$, wherein x satisfies $0 \leq x \leq 1$,
wherein y satisfies $0 \leq y \leq 1$,
wherein x+y satisfies $0 \leq x+y \leq 1$, and
wherein M contains at least one of In and B;
a substrate containing GaN; and
a buffer layer provided between the active layer and a face of the substrate,
wherein the semiconductor device is operated by electrical current flowing through the active layer in a direction parallel to the face of the substrate,
wherein the buffer layer has a composition containing N and at least one of Al and In, and
wherein the buffer layer has a band gap energy wider than that of the substrate, and is lattice-matched to the substrate, wherein a composition ratio of Al and a composition ratio of In in the buffer layer change in a thickness direction such that the buffer layer is lattice-matched to the substrate, and wherein the composition ratio of Al changes due to a change in the composition ratio of In and the composition ratio of In changes due to a change in the composition ratio of Al.

* * * * *